(12) United States Patent
Tsai et al.

(10) Patent No.: US 6,612,667 B2
(45) Date of Patent: Sep. 2, 2003

(54) HARD DISKDRIVE RACK ASSEMBLY

(75) Inventors: Shiang-Shiang Tsai, Taoyuan Hsien (TW); Fan-Mao Tseng, Taoyuan Hsien (TW)

(73) Assignee: Enlight Corporation, Taoyuan Hsien (TW)

( * ) Notice: Subject to any disclaimer, the term of this patent is extended or adjusted under 35 U.S.C. 154(b) by 41 days.

(21) Appl. No.: 10/028,478

(22) Filed: Dec. 28, 2001

(65) Prior Publication Data

US 2003/0102785 A1 Jun. 5, 2003

(51) Int. Cl.[7] .............................................. A47B 97/00
(52) U.S. Cl. .................................... 312/223.1; 361/685
(58) Field of Search .......................... 312/223.2, 223.1, 312/332.1; 361/725, 726, 727, 685, 365; 439/152

(56) References Cited

U.S. PATENT DOCUMENTS

| | | | | |
|---|---|---|---|---|
| 2,609,268 A | * | 9/1952 | Nye ......................... | 312/332.1 |
| 6,052,278 A | * | 4/2000 | Tanzer et al. ................ | 361/685 |
| 6,058,016 A | * | 5/2000 | Anderson et al. ........... | 361/727 |
| 6,154,361 A | * | 11/2000 | Anderson et al. ........... | 361/685 |
| 6,233,143 B1 | * | 5/2001 | Gamble et al. .............. | 361/685 |
| 6,246,580 B1 | * | 6/2001 | Weng .......................... | 361/695 |
| 6,317,329 B1 | * | 11/2001 | Dowdy et al. ............... | 361/725 |
| 6,498,723 B1 | * | 12/2002 | Konshak et al. ............ | 361/685 |

FOREIGN PATENT DOCUMENTS

| | | | | |
|---|---|---|---|---|
| JP | 04148314 A | * | 5/1992 | ............. G06F/1/16 |
| WO | WO 9120083 A1 | * | 12/1991 | ........... G11B/33/12 |

* cited by examiner

Primary Examiner—Lanna Mai
Assistant Examiner—John Fitzgerald
(74) Attorney, Agent, or Firm—Troxell Law Office PLLC (57) ABSTRACT

A hard diskdrive rack assembly is constructed to include a rack and hard diskdrive boxes detachably installed in respective receiving chambers in the rack. The rack has a base frame, the base frame having hooks and locating holes respectively provided at upright sidewalls and partition plates thereof, and a cover covering the base frame, the cover having locating holes and hooks respectively forced into engagement with the hooks and locating holes of the base frame. Each hard diskdrive box has a pivoted pull handle turned between an open position where can move a hard diskdrive in and out of the respective hard diskdrive box, and a close position where the respective hard diskdrive box is locked in the corresponding receiving chamber in the rack.

2 Claims, 8 Drawing Sheets

HARD DISKDRIVE RACK ASSEMBLY

BACKGROUND OF THE INVENTION

1. Field of the Invention

The present invention relates to a hard diskdrive rack and, more particularly, to a simple structure of hard diskdrive rack assembly, which comprises a hard diskdrive rack and a plurality of hard diskdrive boxes detachably mounted in the hard diskdrive rack.

2. Description of the Related Art

Various hard diskdrive racks have been disclosed for use to hold multiple hard diskdrives. These hard diskdrive racks commonly use screws to fix hard diskdrives in position. According to conventional designs, it is inconvenient to install hard diskdrives in a hard diskdrive rack.

SUMMARY OF THE INVENTION

The present invention has been accomplished under the circumstances in view. It is the main object of the present invention to provide a hard diskdrive rack assembly, which facilitates the installation and maintenance of hard diskdrives. According to one aspect of the present invention, the hard diskdrive rack assembly is comprised of a rack, and multiple hard diskdrive boxes holding a respective hard diskdrive and detachably installed in respective receiving chambers in the rack. According to another aspect of the present invention, the rack comprises a base frame, the base frame having hooks and locating holes respectively provided at upright sidewalls and partition plates thereof, and a cover covering the base frame, the cover having locating holes and hooks respectively forced into engagement with the hooks and locating holes of the base frame. According to still another aspect of the present invention, each hard diskdrive box comprises a front face panel, and a pull handle pivoted to the front face panel and turned in and out of the front face panel to control the access through which a hard diskdrive is mounted in the respective hard diskdrive box. When the pull handle turned to the inside of the front face panel, a hooked portion of the pull handle is forced into engagement with a respective hook hole in the rack to lock the respective hard diskdrive box in the corresponding receiving chamber of the rack. On the contrary, when the pull handle turned to the outside of the front face panel, the hooked portion of the pull handle is disengaged from the respective hook hole to unlock the hard diskdrive box, enabling the hard diskdrive box to be taken out of the rack.

DETAILED DESCRIPTION OF THE PREFERRED EMBODIMENT

Figure 1:
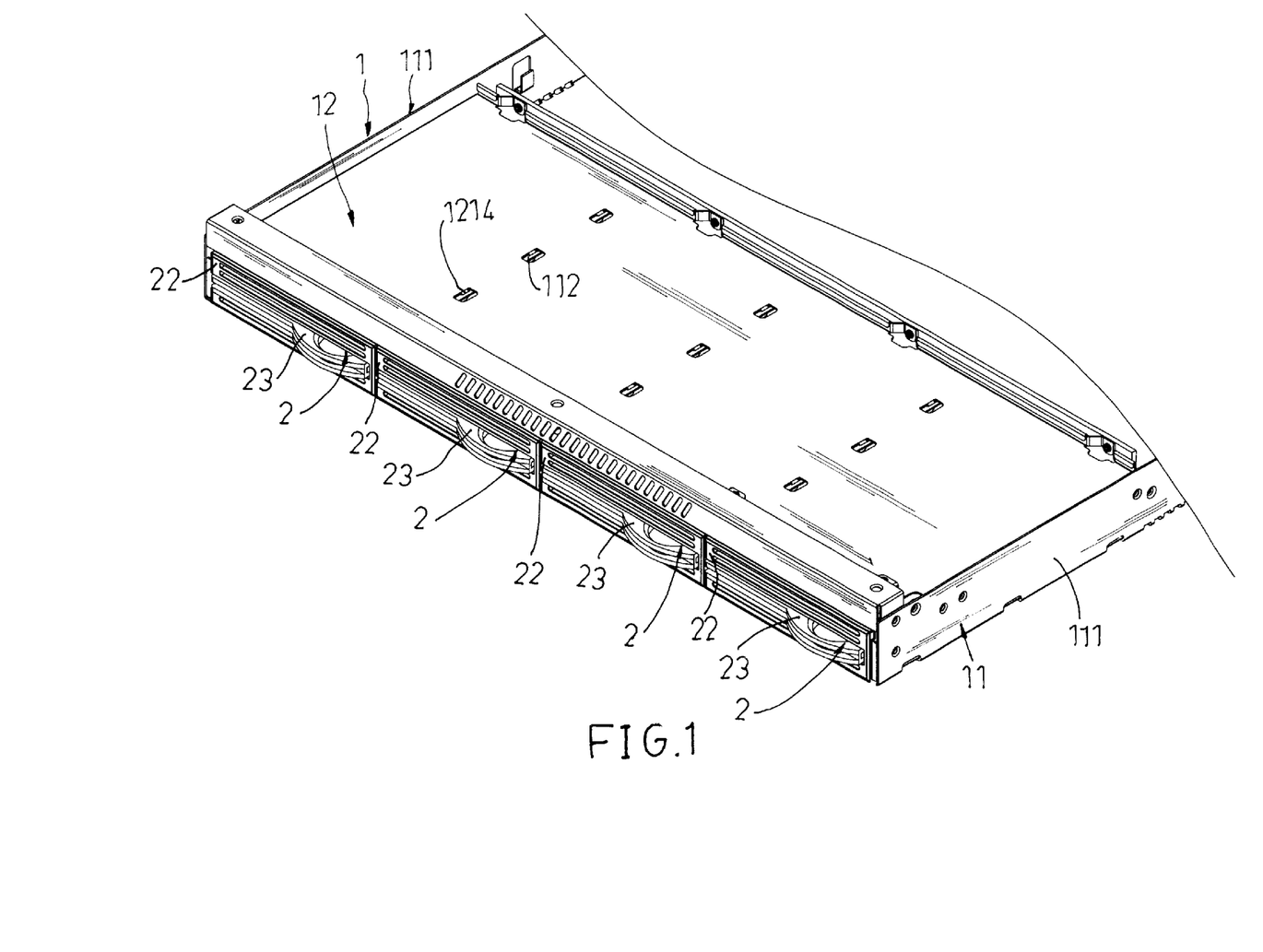
FIG. 1 is a perspective view a hard diskdrive rack assembly constructed according to the present invention.
Figure 2:
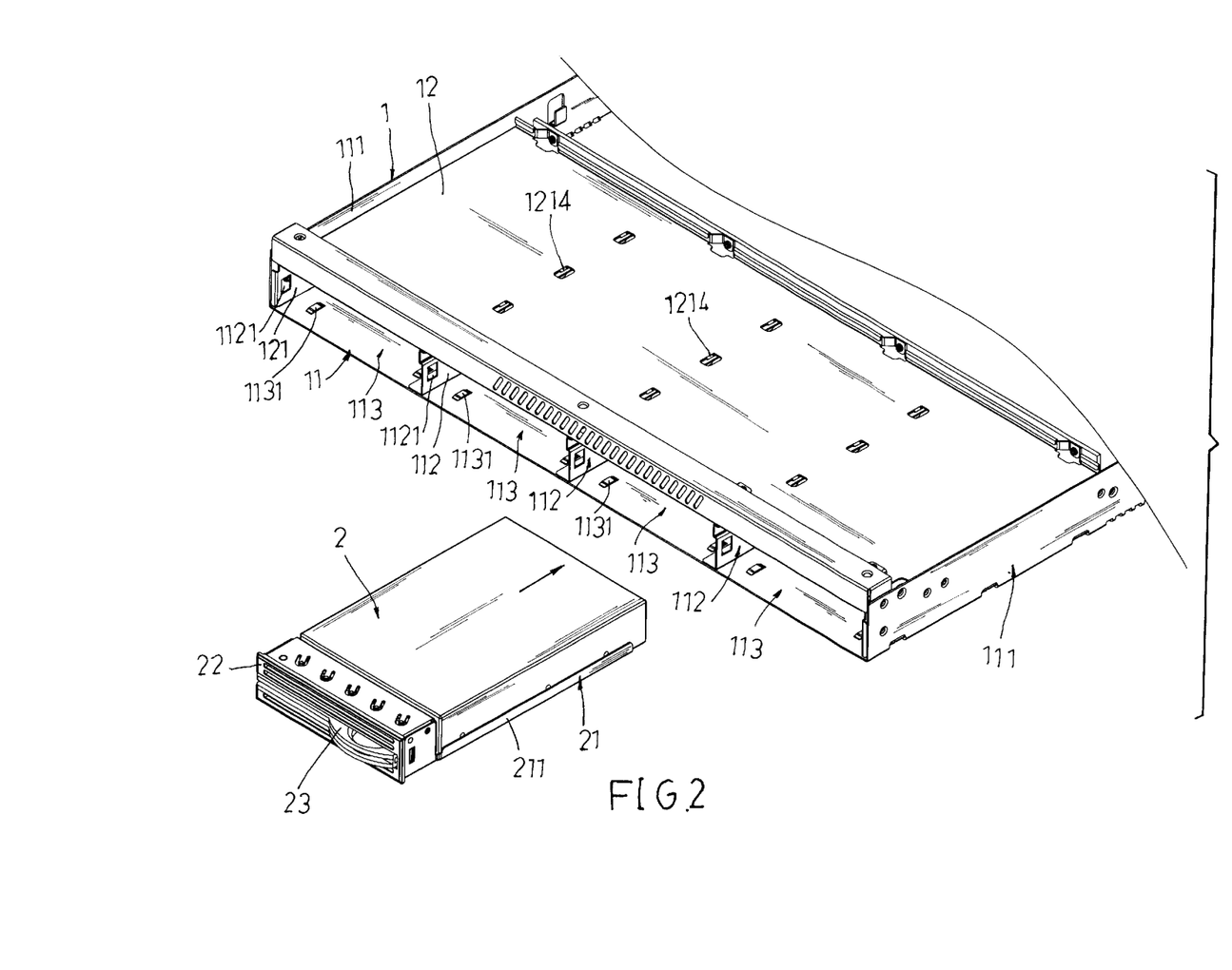
FIG. 2 shows one hard diskdrive box detached from the hard diskdrive rack assembly according to the present invention.
Figure 3:
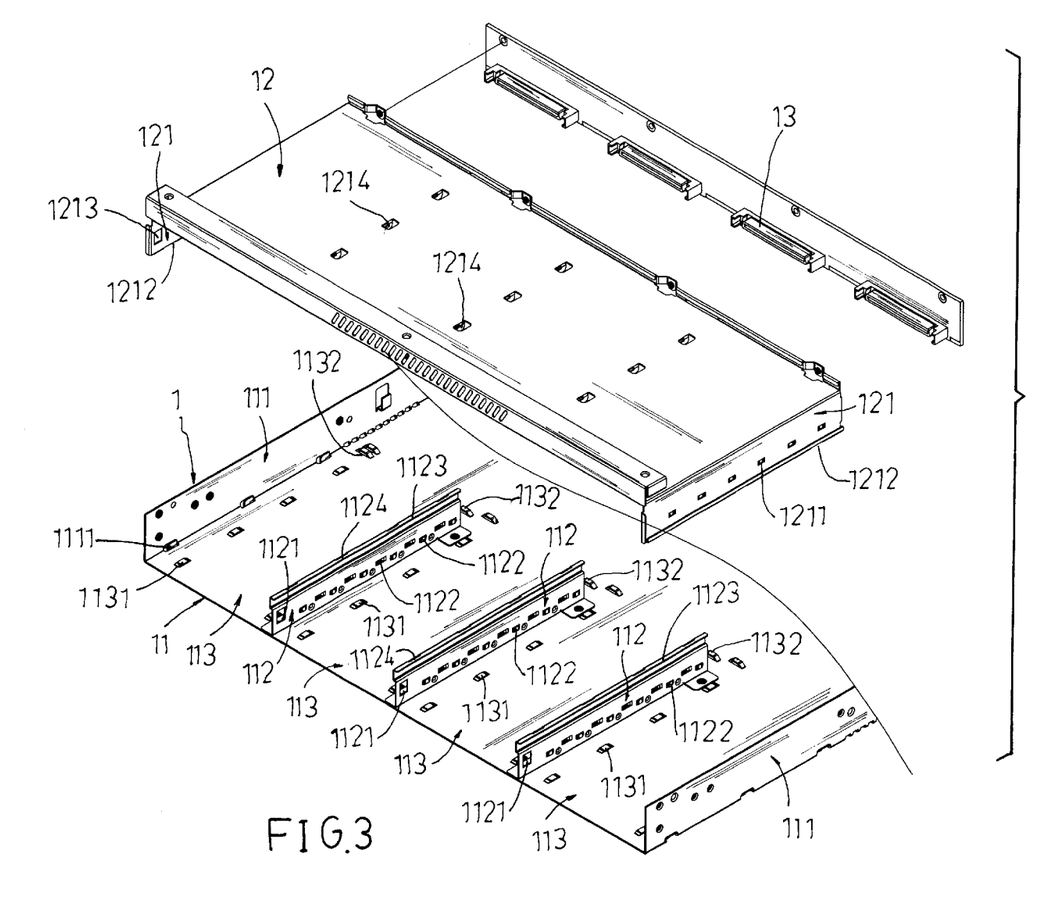
FIG. 3 is an exploded view of the hard diskdrive rack according to the present invention.

Referring to FIGS. from 1 through 3, a hard diskdrive rack assembly in accordance with the present invention is shown comprised of a rack 1 and a plurality of hard diskdrive boxes 2 detachably mounted in the rack 1. The rack 1 is comprised of a base frame 11, a cover 12, and a socket assembly 13. The cover 12 covers the base frame 11. The socket assembly 13 is fastened to the rear side of the cover 12, and adapted to receive the hard diskdrive boxes 2 for signal transmission.

Figure 4:
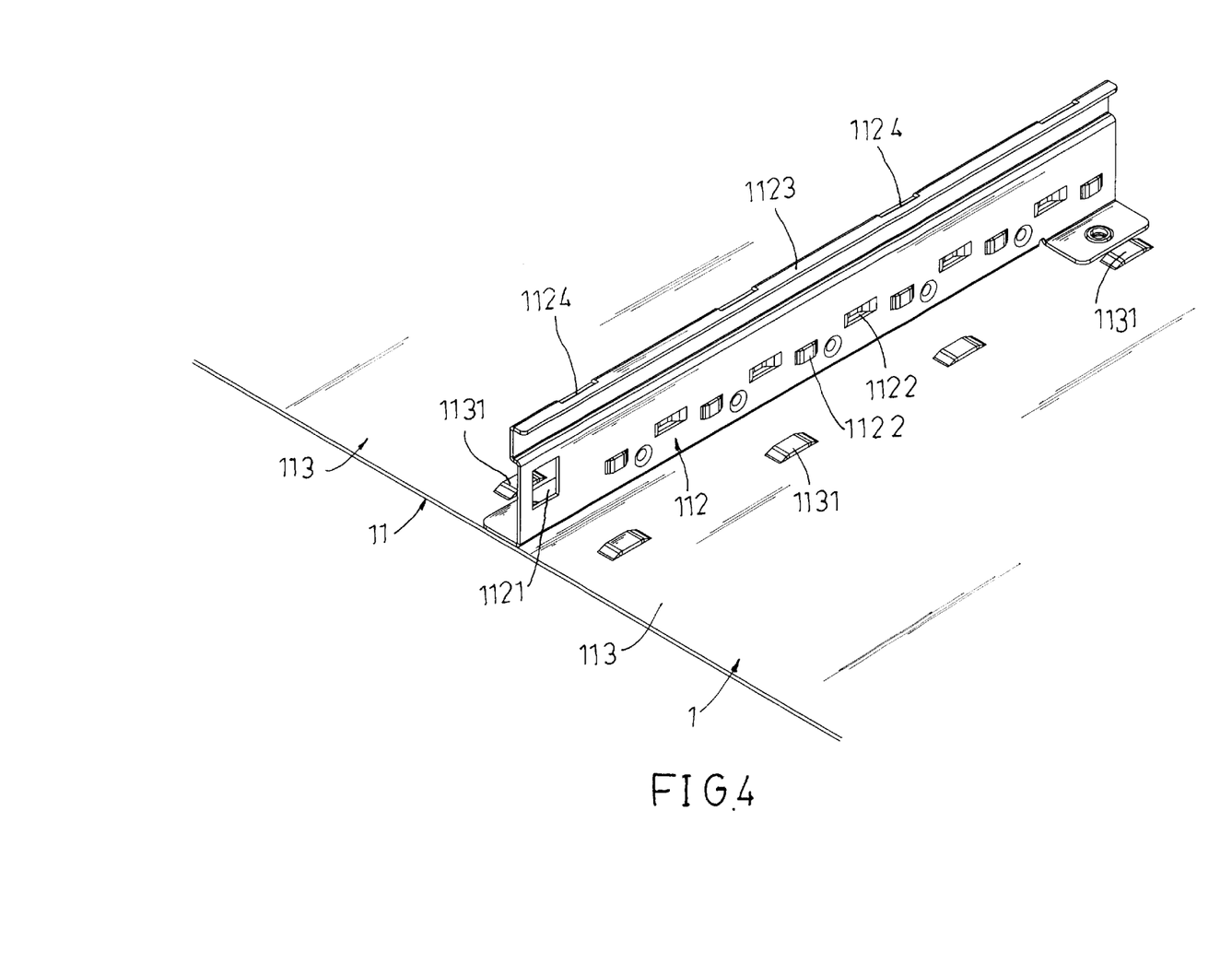
FIG. 4 is an enlarged view of a part of the base frame of the hard diskdrive rack according to the present invention.
Figure 5:
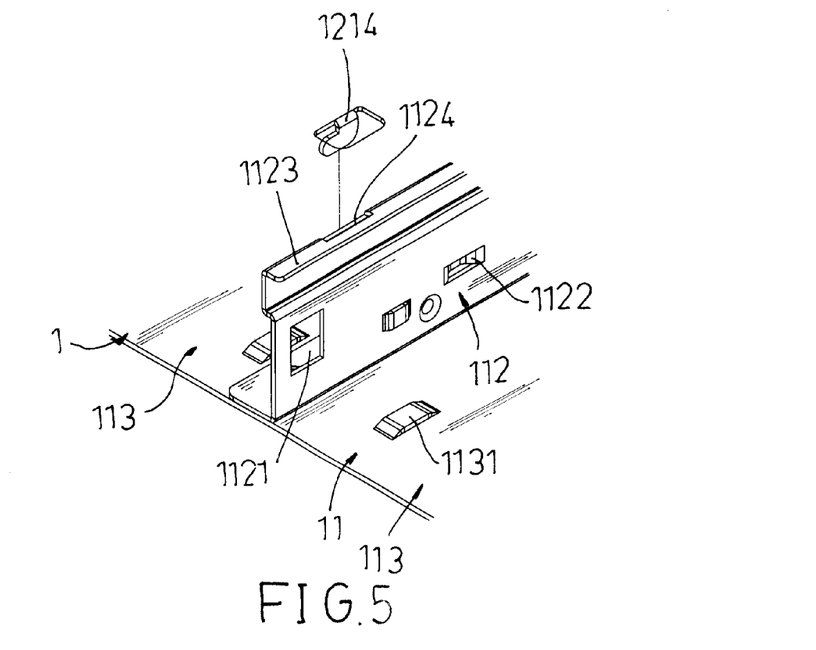
FIG. 5 is an exploded view of a part of the present invention showing the relationship between one hook of the cove and one locating hole of the top locating flange of one partition plate of the base frame of the hard diskdrive rack.
Figure 6:
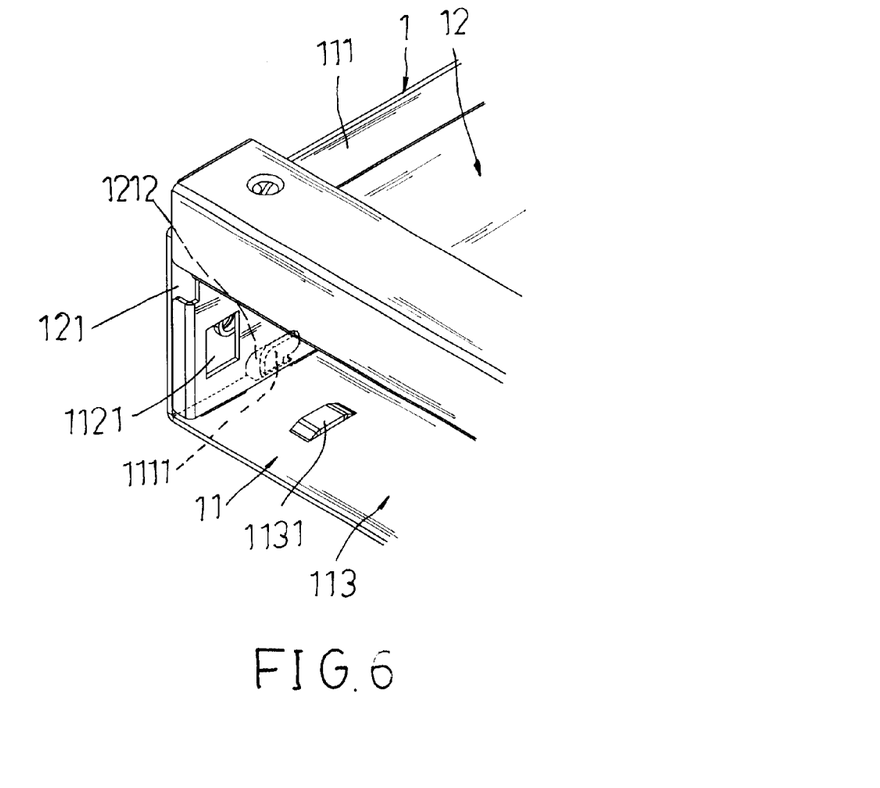
FIG. 6 is a perspective view of a part of the present invention, showing the cover fastened to the base frame of the hard diskdrive rack.
Figure 7:
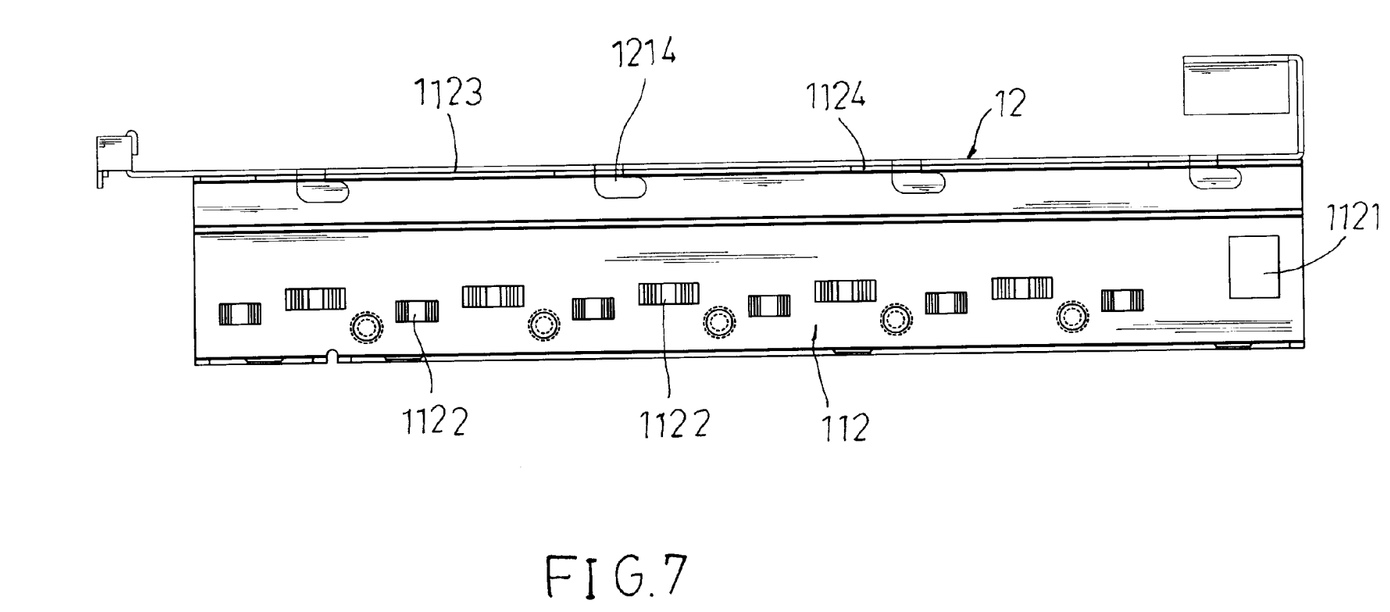
FIG. 7 is a side plain view of the hard diskdrive rack according to the present invention.

The base frame 11 comprises two upright sidewalls 111 at two sides, a plurality of hooks 1111 respectively symmetrically provided in the connection areas between the upright sidewalls 111 and the base frame 11, a plurality of partition plates 112 arranged in parallel between the upright sidewalls 111, a plurality of receiving chambers 113 defined between the upright sidewalls 111 and separated from one another by the partition plates 112 and adapted for receiving the hard diskdrive boxes 2 respectively, rows of longitudinally spaced protruded supporting portions 1131 respectively disposed in the receiving chambers 113, and a plurality of stop blocks 1132 arranged in the receiving chambers 113 and aligned in transverse direction and adapted to stop the hard diskdrive boxes 2 in the receiving chambers 113. The partition plates 112 each comprise a plurality of longitudinally spaced protruded supporting portions 1122 at two sides, a hook hole 1121 at the front side, and a locating flange 1123 at the top side. The locating flange 1123 has a plurality of longitudinally spaced locating holes 1124. The protruded supporting portions 1131 in the receiving chambers 113 and the protruded supporting portions 1122 of the partition plates 112 are so arranged that hard diskdrive boxes 2 can be smoothly moved in and out of the receiving chambers 113 (see FIG. 4). The cover 12 comprises two downward sidewalls 121 respectively inserted into the base frame 11 and attached to the upright sidewalls 111 of the base frame 11 at an inner side, a plurality of protruded supporting portions 1211 respectively disposed in the downward sidewalls 121 at an inner side, a hook hole 1213 disposed in one downward sidewall 121 at the front side, a plurality of locating holes 1212 disposed in the downward sidewalls 121 and respectively forced into engagement with the hooks 111 of the base frame 11 (see FIG. 6), and a plurality of hooks 1214 spaced between the downward sidewalls 121 and respectively hooked in the locating holes 1124 of the locating flange 1123 (see FIGS. 5 and 7).

Figure 8:
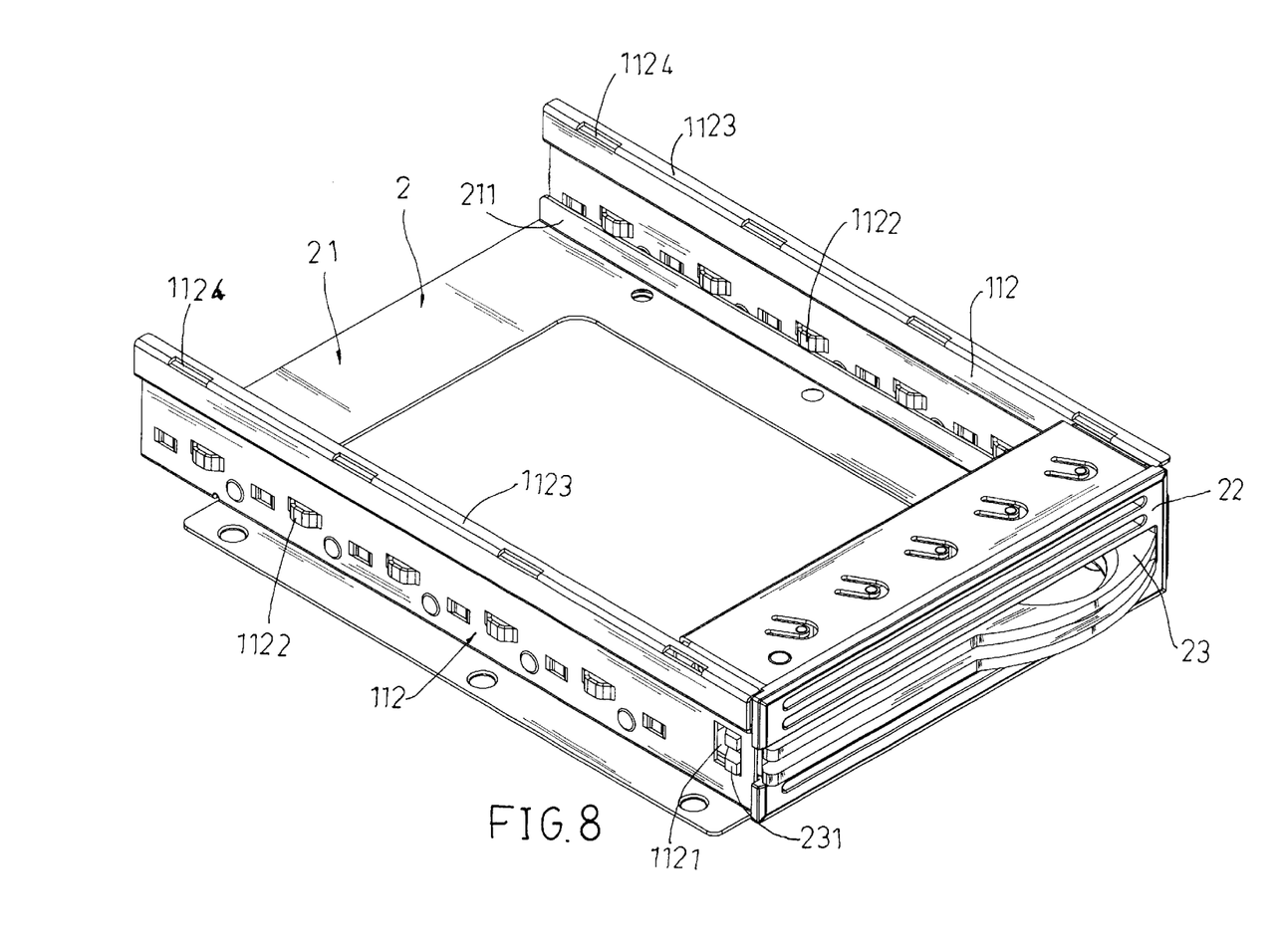
FIG. 8 is a perspective view of one hard diskdrive box according to the present invention.
Figure 9:
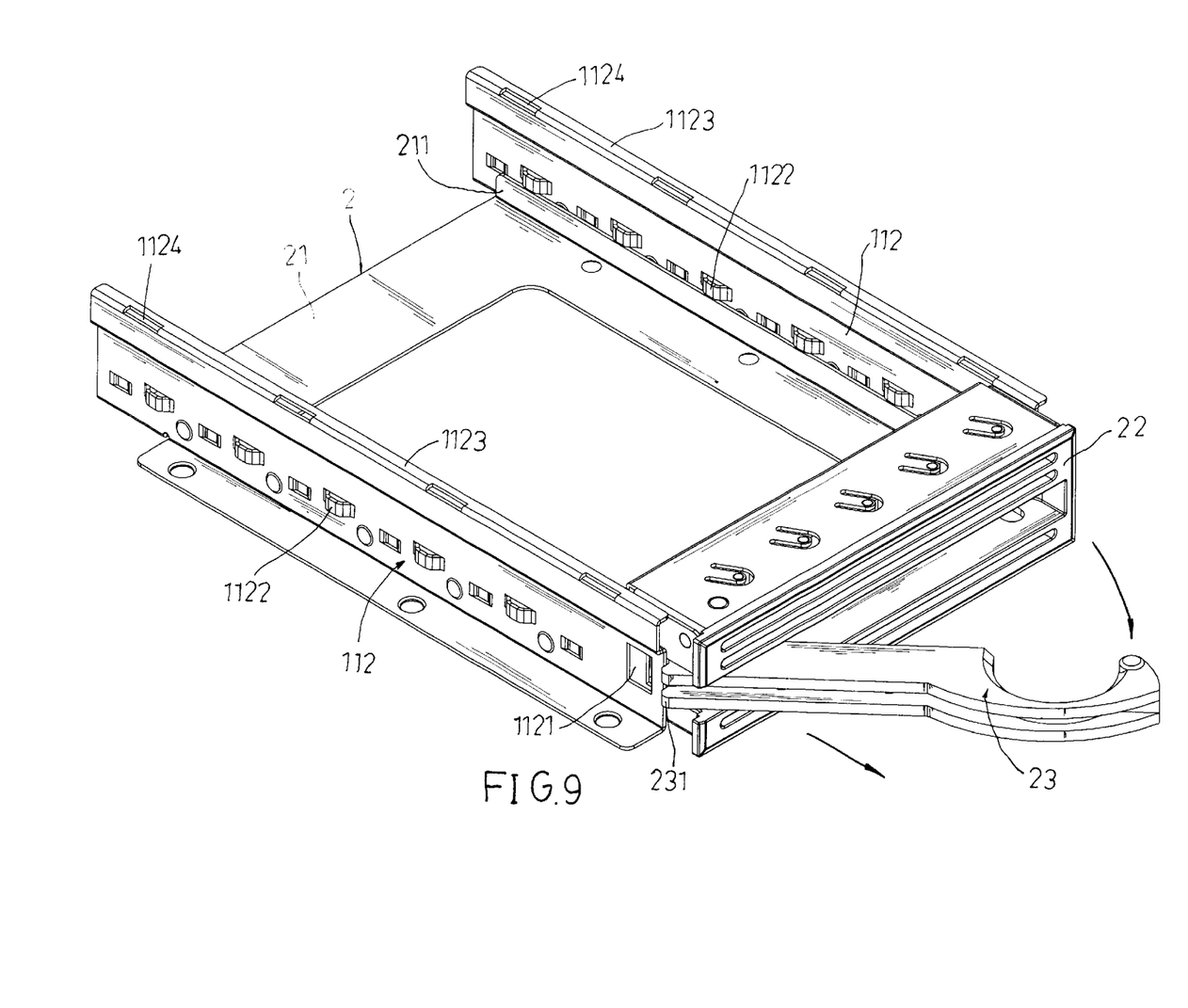
FIG. 9 is similar to FIG. 8 but showing the pull handle extended out of the front face panel of the hard diskdrive box.

Referring to FIGS. 8 and 9 and FIGS. 2 and 3 again, each hard diskdrive box 2 comprises a bottom panel 21 adapted to carry a hard diskdrive, two rails 211 longitudinally arranged at two sides of the bottom panel 21, a front face panel 22, and a pull handle 23 pivoted to the front face panel 22. The pull handle 23 can be moved in and out of the front face panel 22. The pull handle 23 has a fixed end pivoted to the front face panel 22 at one side, and a hooked portion 231 protruded from the fixed end and adapted for hooking in the hook hole 1213 of the cover 12 or the hook hole 1121 of one partition plate 112 of the base frame 11 of the rack 1. When moving one hard diskdrive box 2 in or out of the corresponding receiving chamber 113 of the rack 1, the pull handle 23 is turned out of the front face panel 22 to disengage the hooked portion 231 from the corresponding hook hole 1213 or 1121. When one hard diskdrive box 2 inserted into one receiving chamber 113 of the rack 1, the rails 211 are stopped below the protruded supporting portions 1211 of the cover 12 and/or the protruded supporting portions 1122 of the base frame 11 of the rack 1, and the bottom panel 21 of the hard diskdrive box 2 is supported on the protruded supporting portions 1131 in the corresponding receiving chamber 113, preventing vibration of the hard diskdrive box 2 in the corresponding receiving chamber 113.

After installation of the hard diskdrive box 2 in one receiving chamber 113 of the rack 1, the pull handle 23 is moved in the front face panel 22 to force the hooked portion 231 into the corresponding hook hole 1213 or 1121 to lock the hard diskdrive box 2.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A hard diskdrive rack assembly comprising:

a rack, said rack comprising a base frame, a cover covering said base frame, and a socket assembly fastened to a rear side of said cover, said base frame comprising two upright sidewalls at two sides, a plurality of hooks respectively symmetrically provided in the connection areas between said upright sidewalls and said base frame, a plurality of partition plates arranged in parallel between said upright sidewalls, and a plurality of receiving chambers defined between said upright sidewalls and separated from one another by said partition plates, said partition plates each comprising a hook hole at a front side, and a locating flange at a top side, said locating flange having a plurality of longitudinally spaced locating holes, said cover comprising two downward sidewalls respectively inserted in between the upright sidewalls of said base frame, a hook hole disposed in one downward sidewall at a front side, a plurality of locating holes disposed in said downward sidewalls and respectively forced into engagement with the hooks of said base frame, and a plurality of hooks spaced between said downward sidewalls and respectively hooked in the locating holes of the locating flanges of said partition plates of said base frame; and a plurality of hard diskdrive boxes respectively detachably inserted into the receiving chambers of said rack and adapted to hold a respective hard diskdrive for connection to said socket assembly electrically, said hard diskdrive boxes each comprising a front face panel and a pull handle pivoted to the front face panel and moved between a locking position and an unlocking position, said pull handle having a fixed end pivoted to said front face panel and a hooked portion protruded from said fixed end, which is forced into the hook hole of said cover or the hook hole of one partition plate of said base frame of said rack to lock the respective hard diskdrive box after insertion of the respective hard diskdrive box into one receiving chamber of said rack and positioning of said pull handle in said locking position.

2. The hard diskdrive rack assembly as claimed in claim 1, wherein said rack comprises a plurality of protruded supporting blocks respectively provided in said receiving chamber and at said partition plates and adapted to support said hard diskdrive boxes in said receiving chamber against vibration.

* * * * *